United States Patent [19]

Severing

[11] 4,307,437

[45] Dec. 22, 1981

[54] SEMICONDUCTOR RECTIFIER ASSEMBLY, PARTICULARLY FOR COMBINATION WITH AN AUTOMOTIVE-TYPE ALTERNATOR, AND METHOD OF MANUFACTURE

[75] Inventor: Joachim Severing, Ludwigsburg, Fed. Rep. of Germany

[73] Assignee: Robert Bosch GmbH, Stuttgart, Fed. Rep. of Germany

[21] Appl. No.: 100,255

[22] Filed: Dec. 4, 1979

[30] Foreign Application Priority Data

Dec. 27, 1978 [DE] Fed. Rep. of Germany ....... 2856194

[51] Int. Cl.$^3$ .............................................. H05K 7/20
[52] U.S. Cl. ................................. 361/386; 310/68 D; 363/145
[58] Field of Search ............... 357/76, 81; 174/16 HS; 310/68 R, 68 D; 363/144, 145; 361/331, 380, 381–384, 386, 388

[56] References Cited

U.S. PATENT DOCUMENTS

| | | | |
|---|---|---|---|
| 3,739,209 | 6/1973 | Drabik | 363/145 |
| 3,831,062 | 8/1974 | Haug | 363/145 |
| 3,895,285 | 7/1975 | Bardahl | 363/144 |
| 4,007,402 | 2/1977 | Allport | 361/388 |
| 4,065,686 | 12/1977 | Moore | 363/145 |
| 4,161,016 | 7/1979 | Born | 361/388 |

*Primary Examiner*—Gerald P. Tolin
*Attorney, Agent, or Firm*—Frishauf, Holtz, Goodman & Woodward

[57] ABSTRACT

To provide an easily and essentially automatically manufactured rectifier array for an automotive alternator, two bus rails 1a, 1b, in the form of sheet metal strips, are punched for insertion of connecting studs 6 of rectifier diodes. The bus rails, with the diodes assembled thereto, are placed parallel to, and spaced from each other, and oppositely directed studs 6 from the diodes 4 are connected together by connecting strips 2a, 2b, 2c, which will function as electrical connecting elements and heat sink and heat dissipating plates to conduct off heat arising in operation of the diodes. The subassembly can then be connected into an alternator, with an air directing baffle directing axial airflow. The angled-off cooling and connecting strips which, preferably, are wider than the bus rails, permit placing the assembly to fit around the alternator shaft and associated structures, such as slip rings and the like, with airflow being directed along the major plane of the respective rails and strips, thus permitting efficient flow of cooling air past the strips, efficient cooling, and essentially automated assembly.

13 Claims, 6 Drawing Figures

SEMICONDUCTOR RECTIFIER ASSEMBLY, PARTICULARLY FOR COMBINATION WITH AN AUTOMOTIVE-TYPE ALTERNATOR, AND METHOD OF MANUFACTURE

The present invention relates to a semiconductor rectifier assembly, and its method of manufacture, and more particularly to a diode rectifier array especially adapted for use with automotive-type alternators, to rectify the output voltage therefrom for supply to a battery.

BACKGROUND AND PRIOR ART

Automotive-type alternators typically are three-phase alternators which, to provide d-c power to a battery, are usually associated with rectifier structures to provide the required d-c output. For ease of assembly and maintenance, and to provide a direct d-c output at the housing of the alternator itself, the rectifier structures are usually positioned within the alternator housing. They are cooled by the cooling air drawn through the alternator by a fan assembly, customarily rotating with the alternator shaft. Basically, the three-phase alternator usually has fixed armature windings and a rotating field. In the customarily used alternator, the field is externally excited and receives its current through a pair of slip rings. The current supply to the slip rings is controlled by a voltage regulator. Ordinarily, six power rectifier diodes are used, connected in a rectifying bridge circuit to the output terminals of the alternator phase windings which, usually, are star-connected, although the connection may also be of the delta-type. Three additional rectifier diodes may be provided to supply rectified d-c to the exciter field of the alternator. If the alternator is designed for extremely high power supply, the rectifier diodes may, themselves, consist of parallel connected diode elements. The six power diodes are subdivided into three negative diodes and three positive diodes which, respectively, with their cathodes and anodes are connected to an associated bus, so that the outputs from the diodes can be directly connected to the positive terminal and to the negative terminal—typically ground or chassis—of the generator. The free terminals of respective negative and positive diodes are then connected to a phase terminal of the armature winding, so that the power diodes are connected in a full-wave rectifying bridge circuit.

The rectifier diodes customarily used are semiconductor elements which have a limited operating temperature range. In operation, they generate heat which must be reliably dissipated to prevent heating of the diodes above a predetermined temperature. Usually, the diodes are associated with heat sinks which often are shaped as two or three separate sheet metal heat dissipated elements. Larger size three-phase alternators may have rectifier systems with three separate heat sinks or heat dissipating plates. The electrical connection with the armature windings is then effected by a wire bridge or over a heat dissipating sheet metal element itself. Usually, the sheet metal elements are so located that their major plane is transverse to the direction of cooling airflow. This is undesirable from the point of view of airflow and also is relatively inefficient with respect to heat dissipation or cooling of the heat dissipating element as such. If massive metal heat sinks are used, particularly if additionally furnished with fins, cooling is enhanced but the starting materials, as well as manufacture, is expensive. Additionally, assembly is labor-intensive and thus likewise costly.

THE INVENTION

It is an object to provide a power rectifier assembly, and method to make the same, which is simple, provides for efficient cooling of the system, and is easy to make, preferably by automatic or at least semi-automatic manufacturing steps and which, when finished, can easily be assembled into an alternator structure.

Briefly, two sheet metal strips are provided, spaced from each other to form terminal buses in rail form. Each one retains half of the diodes, that is, three each in a three-phase alternator, the rails being connected to one terminal each of the diodes. Elongated connecting strips have their ends secured to the other terminals of the respective diodes, bridging the rail-shaped buses and connecting them together; preferably, the connecting strips are angled so that the assembly can be placed in the end portion of an alternator, with the shaft and bearing ends fitting into the angled-off portion of the connecting strips. The buses and connecting strips all are sheet metal elements which, when assembled in the alternator, will be positioned with their major planes generally in the direction of airflow through the alternator so that efficient cooling is ensured.

The arrangement has the advantage that simple sheet metal elements can be used to both hold the rectifier diodes in position as well as to form heat sinks therefor which can be readily placed within an alternator in position which results in efficient cooling. This arrangement has substantial manufacturing cost advantages and additionally substantially reduces assembly costs.

In accordance with a feature of the invention, the rail-shaped bus strips are punched with cut-outs into which button-type diodes with oppositely positioned posts are inserted, the cut-outs being of such size that the posts fit therein with an interference fit, thus permitting reliable and fast assembly. The strips can be supplied from a roll to a punch and the terminal posts of the diodes inserted in the punched strips in continuous production processes, and the connecting strips then secured thereto, for example also pre-punched with holes providing an interference fit for connection to the other terminal posts. A continuous production can thus be carried out, with the strips being severed after three diodes, on each strip, have been interconnected. It is then only necessary to connect the resulting rectifier array with the appropriate holding studs or connection terminals in the alternator to complete the assembly.

Drawings, illustrating preferred examples:

The basic concept of the invention is to provide a rectifier assembly for automotive-type alternators of the three-phase type with a minimum of material and resulting in a minimum of initial manufacture and later assembly costs, which still is capable of effective cooling.

Two rail-like strips 1a, 1b are provided to hold the diodes and additionally effect cooling thereof; further, three connecting strips 2a, 2b, 2c (FIG. 2) are provided, interconnecting the diodes and forming heat sinks and cooling elements. The overall assembly then provides six power diodes in a complete rectifier array which is premanufactured to form a subassembly, utilizing a minimum of separate parts, which can be readily mounted at a suitable location on or in an alternating current generator. This attachment to the alternator can, simultaneously, provide for electrical connection to the respective output terminals.

Figure 2:
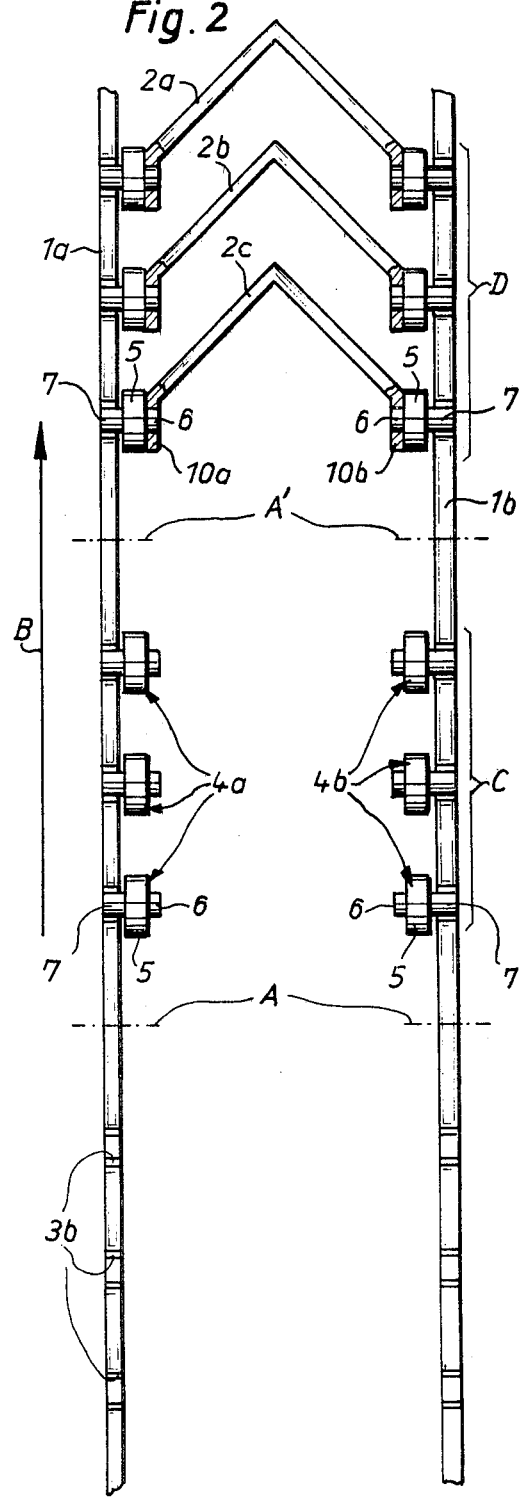
FIG. 2 is a side view of two strips, with the diodes and connecting strips attached, to illustrate a complete subassembly of a rectifier, particularly suitable for automatic assembly.

FIG. 2 illustrates the buses 1a, 1b, in the form of rails, which are located spaced from each other and facing each other, that is, parallel to each other. The rectifier diodes are positioned at the inner facing sides, with the connecting strips 2a, 2b, 2c bridging the gap between the rails 1a, 1b.

The rails 1a, 1b and the cooling connecting strips 2a, 2b, 2c (FIG. 2) advantageously are preformed sheet metal elements which can be easily and inexpensively made and worked.

Figure 1:
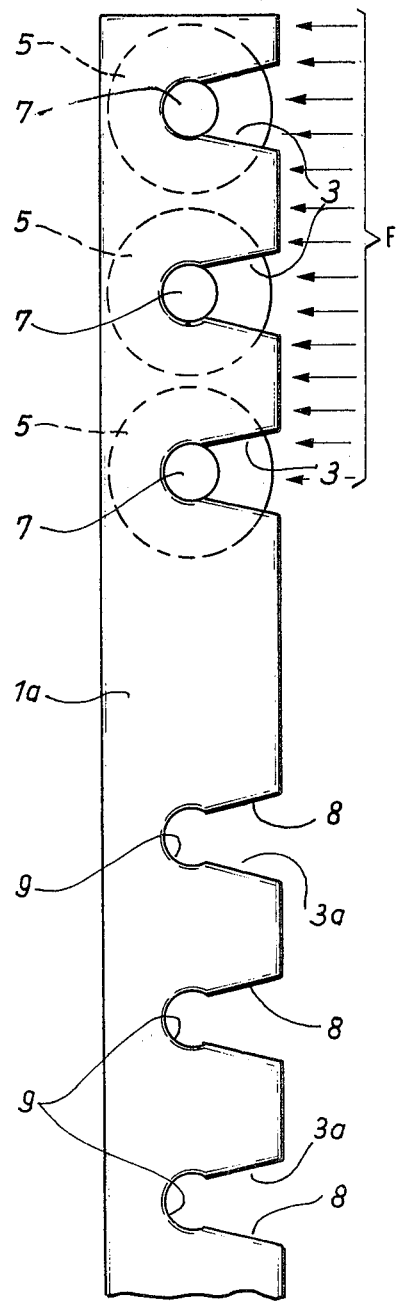
FIG. 1 is a top view of a connecting strip, showing the punch lines and, in a subsequent step, insertion of diodes.

In accordance with the method of manufacture, a strip of the width of the strip 1a is provided, for example, from a roll, and punched with punch holes 3a, 3. Diodes are then inserted in the respectively punched holes and the strip is later on severed, preferably when the assembly of the diode rectifier system has been completed. The strips are severed at the severing lines A (FIG. 2). The rectifier diodes 4a, 4b are inserted with an end terminal stud or bolt into the respective holes 3, 3a, 3b of the rails (FIG. 2). The diodes have an enlarged center portion 5 which terminates in the oppositely positioned studs or bolts 6, 7 which, simultaneously, for the cathode and anode terminals for the diodes and, of course, are insulated with respect to each other. The diodes 4a, 4b—see FIG. 1—are inserted with the end studs 7 in the respective holes 3, 3a, 3b. They can be held in the holes by an interference fit or, if desired, they can be soldered into the strips by a subsequent soldering step which can be automatic and be part of an automated manufacturing sequence. Soldering-in of the diodes can be effected by dip-soldering or wave-soldering from the back side of the rails, that is, in FIG. 2, from the outer sides thereof.

To facilitate insertion of the diode studs or bolts 7 into the respective openings of the rail, the cut-outs 3, 3a preferably have a conically expanding or otherwise enlarged insertion region 8 (FIG. 1) which then merges into the actual seating region 9.

The inserted diodes 4a, 4b in the respective rails 1a, 1b are interconnected by cooling-connecting strips 2a, 2b, 2c (FIG. 2) which are inward of the parallel arranged rails 1a, 1b and extend transversely between the respective rails to connect respectively associated diodes to each other to form an electrical connection for a phase, each, of the armature windings associated with the respective diode pair. These cooling and connecting strips which, preferably, are simple sheet metal elements, have end portions 10a, 10b which can be cut out similar to the cut-outs 3, 3a, 3b, and which are secured to the inner studs or terminal bolts 6 of the diodes 4a, 4b. Attachment can be similar to the attachment of the studs or bolts 7 to the rails 1a, 1b. It is also possible, however, to merely shape the end portions of the connecting rails 2a, 2b, 2c such that they only have openings which are guided over the end studs 6 of the diodes and are then soldered.

Figure 3:
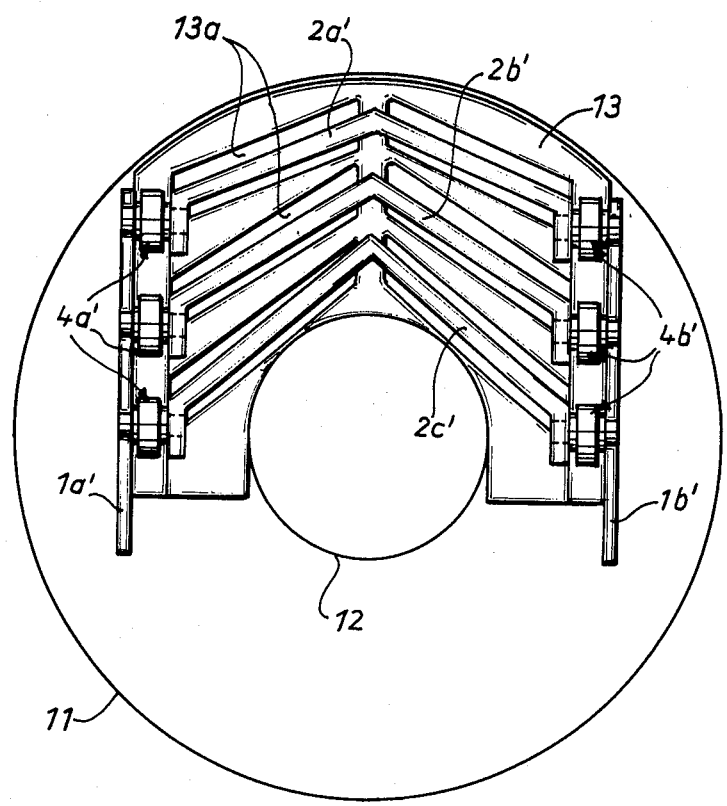
FIG. 3 illustrates a rectifier assembly positioned in an alternator, of which only those portions necessary for an understanding of the present invention are shown.

After severing the assembly shown at the top portion of FIG. 2 at the severing line A', the rectifier subassembly can be inserted into an alternator, as best seen in FIG. 3. The outer bus rails 1a', 1b', after having been severed, the connecting strips 2a', 2b', 2c' and the respective rectifier diodes 4a' 4b' are so positioned that the angle formed by the respective connecting strips fits around the central portion 12 of the alternator. The circle defining the outer limit of the central portion 12, schematically, shows the bearing for the alternator and the outer diameter of the slip rings therefor. The angle of bending of the respective strips 2a', 2b', 2c' is preferably an obtuse angle, so bent that a space saving, simple assembly is made possible. The end portions of the connecting cooling strips are parallel to the rails 1a', 1b', as seen in FIG. 2. The inner circumference of the end portion of the alternator is shown schematically by the circle 11. A cooling air directing baffle or shield 13 is associated with the rectifier assembly; the shield 13 may be a metal or plastic element which directs cooling air through slits 13a formed therein, positioned in the region of the respective cooling and connecting strips 2a', 2b', 2c', so that air drawn axially through the alternative, that is, in the direction of the arrows F (FIG. 1), will flow past the cooling and connecting strips. The cooling strips act as heat sinks with respect to the diodes to conduct heat arising therein in operation away from the diodes and provide for effective cooling thereof. The rails 1a', 1b' preferably are positioned just slightly outside of baffle 13 to be additionally placed within the stream of cooling air drawn axially through the machine. Additional cooling openings in the baffle 13 may be formed to directly cool the lateral sides of the diodes as well. Due to some unavoidable turbulence and spillover of the airflow laterally of the directing openings, effective overall cooling of the entire structure is obtained.

Figure 5:
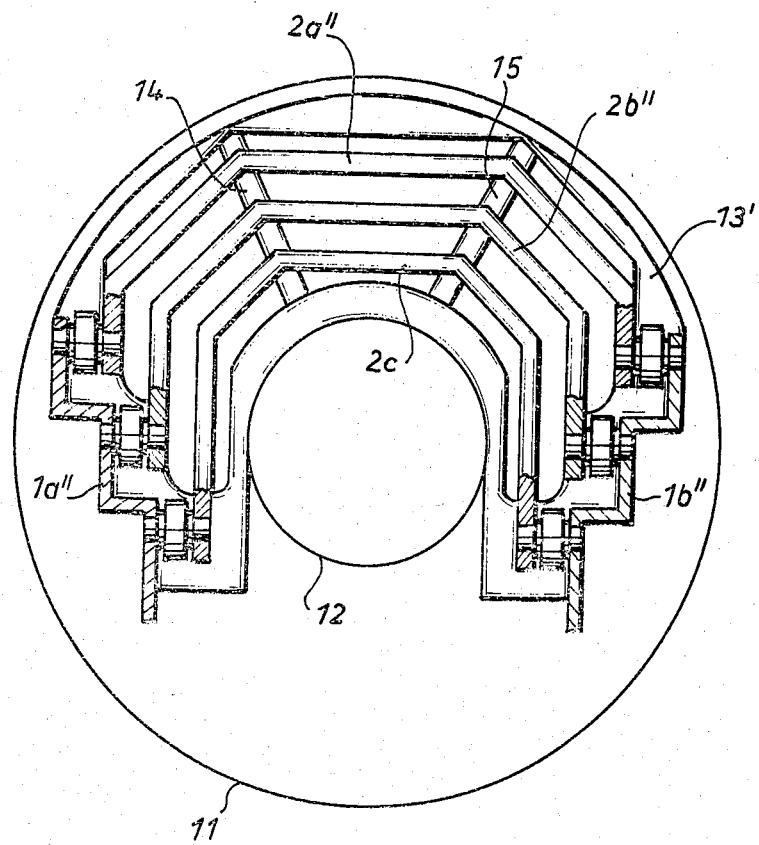
FIG. 5 is an end view similar to FIG. 3 and showing a different embodiment of a rectifier assembly.

The actual shape of bending of the respective strips 2a', 2b', 2c' will depend on design considerations. For example, in a different form, and if a better space utilization for cooling air is desired, the connecting and cooling strips for the diodes, which connect the diodes in the rails, can be shaped as shown in FIG. 5. The respective rails 1a" and 1b" are angled off in stepped form; the cooling strip connecting rails 2a", 2b", 2c" have a polygonal outline. Of course, the exact shape of the cooling strips is not critical; they may, of course, be at least part-circular to fit about the rotary center portion, schematically shown by the circle 12 of the alternator. The air-directing baffle 13' (FIG. 5) then will have a matching shape. It may additionally be utilized to attach the semiconductor rectifier system by having formed holding clips at the connecting spokes 14, 15 which clip around the respective connecting strips 2a", 2b", 2c" and/or the rails 1a", 1b". If the baffle is plastic, a single molding can be provided with notch projections into which the respective rails can be snapped; if of metal, insulating bushings or insulated snap projections would have to be provided.

Figure 4:
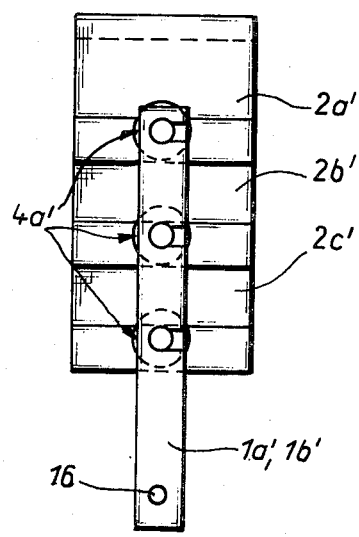
FIG. 4 is a side view of the rectifier assembly of FIG. 3.

The connecting strips 2a, 2b, 2c; 2a', 2b', 2c'; 2a", 2b", 2c" preferably are wider than the main bus strips 1a, 1b, 1a", 1b", as best seen in FIG. 4. FIG. 4 also shows that the respective rail or strip can be preformed with an attachment hole 16 to attach the respective rails to an electrical and mechanical connection on the alternator itself.

Figure 6:
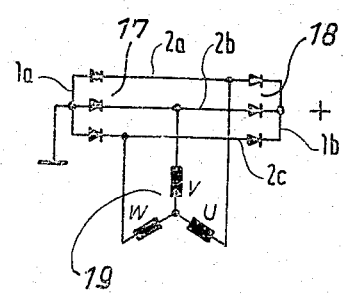
FIG. 6 is a highly schematic circuit diagram of the rectifier, connected to the armature windings of an automotive-type alternator, and omitting all elements not necessary for an understanding of the present invention.

FIG. 6 illustrates one suitable electrical circuit of the semiconductor rectifier diodes in a three-phase alternator. The combined anodes of the negatives diodes 17 are connected to the rail 1a, the combined cathodes of the positive diodes 18 are connected to the positive bus strip 1b. A cathode of a negative diode, each, and the anode of a positive diode, each, interconnected by a respective strip 2a, 2b, 2c, then is connected to respective output terminals from the armature windings U, V, W of the armature 19 of the alternator. The connection of the alternator terminals can be effected at any one position along the respective and connecting and cooling strips in any suitable manner.

The arrangement permits substantial simplification in the manufacture and assembly of the rectifier system.

With reference to FIG. 2, the bus strips 1a, 1b can be punched and fed to an assembly position in which the respectively associated diodes are secured thereto, in an automatic punch and insertion sequence. The strip is fed in the direction of the arrow B of FIG. 2. After assembly of the diodes in the region C of the assembly apparatus, and upon preferably continuous transport of the strip into the region B, the pre-bent strips 2a, 2b, 2c are attached to connect two rails 1a, 1b together. This process also can be carried out automatically with subsequent soldering of the respective bolts or studs 6 of the diodes to the end portions 10a, 10b of the connecting strips 2a, 2b, 2c. Thereafter, the subassembly is severed at the severing line A' to form a rectifier subassembly which can be directly connected as a unit into the end region or portion of an alternator. It is then only necessary to make a single electrical connection to the positive output of the generator, the negative output, as customary, being formed by the chassis or housing portion thereof, to which the rail 1a (FIG. 6) is connected.

Various changes and modifications may be made, and features described in connection with any one of the embodiments may be used with the other, within the scope of the invention concept.

The connecting strips 2a, 2b, 2c, when associated with the respective baffles 13, 13', may be so arranged that the airflow does not pass directly axially with respect thereto, but the strips can be additionally bent off from a plane parallel to the axis of the machine, so that air directed to the cooling strips will not flow exactly axially with respect thereto, but be deflected to some extent in a transverse direction. The inclination of the plates with respect to the axis of the machine should be distinguished, however, from placing the strips so that their major plane is transverse to the axis of the machine; the inclination should be no more than that which can be obtained without essential interference with axial airflow.

What is claimed is:

1. In combination with an automotive type multiphase alternator having an axis, phase windings, and an axial stream (F) of cooling air flow therethrough,
a semi-conductor rectifier assembly having
a plurality of rectifier diodes (4a, 4b; 4a', 4b') and a support and cooling structure for the diodes, comprising,
two outer sheet metal strips (1a, 1b; 1a', 1b'; 1a", 1b")forming terminal bus rails, positioned spaced from each other, half of the diodes (4a, 4b; 4a', 4b') being connected with one terminal, each, to a respective strip, a diode of one half forming, with a diode of the other half, a diode pair
and means for cooling and electrically connecting the diodes comprising elongated combined heat sink cooling and connecting sheet metal strips (2a, 2b, 2c; 2a', 2b', 2c'; 2a", 2b", 2c") having their respective ends secured to respective terminal bus rails of the respective diodes and respectively connected to a phase winding of the alternator, so that each phase winding is connected to a diode pair,
the connecting sheet metal strips being located in the alternator, within the stream of cooling flow through the alternator;
said terminal bus rails and said combined heat sink, cooling and conecting metal strips having their major planes positioned substantially in a plane parallel to the axis of the alternator.

2. Assembly according to claim 1, wherein the terminal bus rails (1a, 1b; 1a', 1b'; 1b") are formed with cut-outs (3, 3a);
the diodes have projecting terminal bolts or studs, said studs fitting into said cut-outs and securing the diodes to the respective rails;
and wherein the sheet metal strips are positioned parallel to each other, with the diodes inserted therein facing each other, the diodes being positioned in electrical connection and heat conductive relation in the respective bus rail.

3. Assembly according to claim 1, wherein the diodes are secured to the spaced bus rails at the sides facing each other;
and the end portions of the cooling connecting elongated metal strips (2a, 2b, 2c; 2a', 2b', 2b', 2c'; 2a", 2b", 2c") extend parallel to the terminal bus rails, the center portions of said strips being bent to leave a free space between the rectifier diodes to permit fitting of the complete assembly about a center portion (12) of the alternator.

4. Assembly according to claim 3, wherein the connecting strips are angled with an obtuse angle.

5. Assembly according to claim 3, wherein (FIG. 5) the connecting strips are angled off in polygonal form.

6. Assembly according to claim 3, wherein (FIG. 5) the terminal bus rails (1a", 1b") are stepped or longitudinally offset between adjacent rectifier diodes, and the rectifier assembly is assembled to the alternator such that the stepped rail assembly fits generally within a circular outline surrounding the central portion (12) of the alternator.

7. Assembly according to claim 6, wherein (FIG. 5) the connecting strips are angled off in polygonal form;
and wherein the end portions (10a, 10b) of the cooling connecting strips extend parallel to the respective bus rails.

8. Assembly according to claim 1, wherein the rectifier diodes (4a, 4b) have a central portion of general disk-shaped region (5) and two terminal bolts or studs (6, 7) extending transversely from said disk-shaped portion;
and the terminal bus rails, and the cooling and connecting strips, respectively, are formed with openings receiving respective studs or bolts.

9. Assembly according to claim 8, wherein the studs or bolts are connected in the respective openings by an interference fit.

10. Assembly according to claim 1, wherein the cooling and connecting strips (2a, 2b, 2c) are substantially wider than the bus rails (1a, 1b).

11. Method of manufacturing a semiconductor rectifier assembly having a plurality of rectifier diodes and a cooling and support structure thereof, comprising supplying two terminal bus rails in elongated strip form, said bus rails being formed with cut-outs;

inserting terminal studs (7) of the rectifier diodes in the cut-outs;

positioning said rails, with the diodes inserted, to be parallel to each other, and with the diodes facing each other with a gap between the diodes;

feeding said so positioned bus rails, with the diodes thereon in longitudinal direction;

and inserting elongated cooling and connecting sheet metal strips to the facing sides of the diodes as they are being fed, and bridging the gap between said bus rails and the diodes, said strips being longer than the distance between the bus rails and being bent in the direction of feed of said bus rails, wherein the cooling and connecting strips are preformed; the rectifier diodes are formed with inwardly extending connecting bolts or studs, and the cooling and connecting strips are automatically assembled to said cooling and connecting studs.

12. Method according to claim 11, including the step of severing the bus rails three rectifier diodes, each, have been assembled to the respective bus rails to form a six-rectifier diode subassembly;

and assembling said subassembly to an alternator.

13. Method according to claim 11, including the step of assembling said sub-assembly to an alternator having a center portion (12); and wherein the gap is wider than the center portion (12) of the alternator.

* * * * *